United States Patent
Seidel et al.

(10) Patent No.: US 8,580,684 B2
(45) Date of Patent: Nov. 12, 2013

(54) CONTACT ELEMENTS OF SEMICONDUCTOR DEVICES COMPRISING A CONTINUOUS TRANSITION TO METAL LINES OF A METALLIZATION LAYER

(75) Inventors: Robert Seidel, Dresden (DE); Kai Frohberg, Niederau (DE); Carsten Peters, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 252 days.

(21) Appl. No.: 12/939,523

(22) Filed: Nov. 4, 2010

(65) Prior Publication Data
US 2011/0210447 A1 Sep. 1, 2011

(30) Foreign Application Priority Data
Feb. 26, 2010 (DE) .......................... 10 2010 002 451

(51) Int. Cl.
*H01L 21/44* (2006.01)
(52) U.S. Cl.
USPC ................................. 438/672; 257/E21.586
(58) Field of Classification Search
USPC ................... 438/672, 675; 257/E21.586, 774
See application file for complete search history.

(56) References Cited

U.S. PATENT DOCUMENTS

| 5,705,430 | A | 1/1998 | Avanzino et al. |
| 6,448,185 | B1* | 9/2002 | Andideh et al. ............. 438/706 |
| 2002/0137276 | A1 | 9/2002 | Park |
| 2005/0253272 | A1* | 11/2005 | Ohtake et al. ................. 257/759 |
| 2006/0019498 | A1* | 1/2006 | Ali ................................. 438/706 |
| 2006/0121721 | A1* | 6/2006 | Lee et al. ....................... 438/618 |
| 2008/0076244 | A1* | 3/2008 | Ye et al. ......................... 438/597 |
| 2008/0233743 | A1* | 9/2008 | Costrini et al. ............... 438/675 |
| 2009/0243116 | A1 | 10/2009 | Feustel et al. |

FOREIGN PATENT DOCUMENTS

EP 1 120 822 A1 8/2001
JP 10261707 A 9/1998

OTHER PUBLICATIONS

Translation of Official Communication from German Patent Application 10 2010 002 451.1 dated Oct. 18, 2010.

* cited by examiner

*Primary Examiner* — Wael Fahmy
*Assistant Examiner* — Sarah Salerno
(74) *Attorney, Agent, or Firm* — Williams, Morgan & Amerson, P.C.

(57) ABSTRACT

In sophisticated semiconductor devices, contact elements in the contact level may be formed by patterning the contact openings and filling the contact openings with the metal of the first metallization layer in a common deposition sequence. To this end, in some illustrative embodiments, a sacrificial fill material may be provided in contact openings prior to depositing the dielectric material of the first metallization layer.

17 Claims, 8 Drawing Sheets

CONTACT ELEMENTS OF SEMICONDUCTOR DEVICES COMPRISING A CONTINUOUS TRANSITION TO METAL LINES OF A METALLIZATION LAYER

BACKGROUND OF THE INVENTION

1. Field of the Invention

The present disclosure generally relates to the fabrication of integrated circuits, and, more particularly, to the contact level of a semiconductor device, in which contact areas of semiconductor circuit elements, such as gate electrodes and drain and source regions, are connected to the metallization system of the semiconductor device on the basis of contact elements.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, a large number of field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain terminal and a source terminal.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor elements but the electrical performance of the complex wiring network, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, to establish a connection of the circuit elements with the metallization layers, an appropriate contact structure is provided, which connects to a respective contact region of a circuit element, such as a gate electrode and/or the drain and source regions of transistors, and to a respective metal line in the first metallization layer. The contact structure may comprise contact elements or contact plugs formed in an interlayer dielectric material that encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability and performance of the integrated circuits. Consequently, in lower lying metallization levels, metal lines and vias having critical dimensions of approximately 100 nm and significantly less may have to be provided in order to achieve the required packing density in accordance with the density of circuit elements in the device level.

Upon further reducing the dimensions of the circuit elements, for instance using critical dimensions of 50 nm and less, the contact elements in the contact level may have to be provided with appropriate critical dimensions on the same order of magnitude. The contact elements may typically represent plugs, trenches and the like which are formed of an appropriate metal or metal composition, wherein, in sophisticated semiconductor devices, tungsten, in combination with appropriate barrier materials, has proven to be a viable contact metal. When forming tungsten-based contact elements, typically, the interlayer dielectric material is formed first and is then patterned so as to receive contact openings, which may extend through the interlayer dielectric material to the corresponding contact areas of the circuit elements. For this purpose, openings of very different depth may have to be formed in the interlayer dielectric material in order to connect to gate electrode structures or any other conductive lines formed above the semiconductor layer, while other contact openings have to extend down to the semiconductor layer, i.e., any contact areas formed therein. In particular, in densely packed device regions, the lateral size of the drain and source areas, and thus the available area for the contact regions, may be 100 nm and less, thereby requiring extremely complex lithography and etch techniques in order to form the contact openings with well-defined lateral dimensions and with a high degree of alignment accuracy, while the difference in etch depth may additionally contribute to the overall complexity of the patterning process. After exposing the contact areas, frequently provided in the form of metal silicide regions, a barrier material is frequently provided, for instance in the form of a material system including titanium and titanium nitride, wherein the titanium material may provide the required adhesion characteristics, while the titanium nitride material may preserve integrity of the interlayer dielectric material during the subsequent deposition of the tungsten material, which may be accomplished on the basis of sophisticated chemical vapor deposition (CVD) techniques in which a direct contact between silicon dioxide based materials and the deposition ambient for depositing the tungsten material is to be avoided. Typically, the actual deposition of the tungsten material may be preceded by the deposition of a nucleation layer based on tungsten, which may be accomplished by a dedicated deposition step, after which the actual fill material may be provided. After the deposition of these materials, any excess material may be removed, for instance by chemical mechanical polishing (CMP), thereby forming the isolated contact elements in the interlayer dielectric material. Although the process sequence for patterning the contact openings and filling these openings with barrier materials and tungsten results in contact elements having a desired contact resistivity for semiconductor devices with critical dimensions of 50 nm, a further reduction of the size of the transistors may result in an increased contact resistivity, which may no longer be compatible with the device requirements. That is, upon further device scaling, the increased contact resistivity, which may result from conventional tungsten-based contact regimes, may represent a limiting factor of the operating speed of the integrated circuits, thereby at least partially offsetting many advantages obtained by the further reduction of the critical dimensions in the device level.

In particular, the material removal process for removing any excess material of the tungsten after filling the contact openings may represent a critical process step, since a reliable removal of any excess metal has to be guaranteed, thereby requiring appropriately set over-polishing process time, which, however, may result in a pronounced surface topography. Consequently, the further processing, i.e., the deposition and patterning of the dielectric material of the first metallization layer, may have to be adapted to the pronounced surface topography. Furthermore, in particular, increased contact resistivity has been identified to be caused by the inferior resistivity of the conductive barrier materials, since, upon further device scaling, the amount of tungsten material may have to be reduced, while the thickness of the conductive barrier material may not be arbitrarily reduced in the same manner. Consequently, the fraction of the overall contact resistance of the conductive barrier material increases upon further device scaling. Moreover, the discontinuity in the materials between the first metallization layer and the contact elements, i.e., the transition from the highly conductive copper to the tungsten material in combination with the conductive barrier material formed in the metal line may increasingly contribute to the overall contact resistivity, in particular upon further device scaling. Consequently, in sophisticated semiconductor devices, the conventional tungsten-based contact regime may increasingly reduce device performance, even if highly sophisticated semiconductor contact elements may be provided in the device level of the semiconductor device.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the contact level of sophisticated semiconductor devices may receive contact elements, such as contact plugs, contact trenches and the like, with superior electrical performance without requiring additional sophisticated process steps. To this end, contact openings may be formed in the interlayer dielectric material, i.e., in the material formed above and adjacent to circuit elements, such as transistors, in the device level of the semiconductor device, on the basis of any appropriate patterning regime, however, without providing the contact fill material. During the deposition of the dielectric material of the first metallization layer, undue material deposition in the previously patterned contact openings may be suppressed and, after forming appropriate trenches in the dielectric material of the metallization layer, the contact opening and the trench may be filled with any appropriate conductive material, such as copper-based materials, silver and the like, possibly in combination with conductive barrier materials, thereby providing a substantially homogeneous transition between the metal line and the contact element. Consequently, a superior overall contact resistance may be achieved since, generally, a contact material of superior conductivity may be applied, while at the same time avoiding any conductive barrier materials between the contact elements and the metal lines of the first metallization layer, which may contribute to a significantly increased contact resistivity in sophisticated semiconductor devices.

One illustrative method disclosed herein relates to forming a contact element in a semiconductor device. The method comprises forming a sacrificial fill material in a contact opening that is formed in an interlayer dielectric material, wherein the contact opening connects to a contact area of a circuit element that is formed in a semiconductor region of a semiconductor device. The method further comprises forming a dielectric material of a metallization layer above the interlayer dielectric material including the sacrificial fill material. Additionally, the method comprises forming a trench in the dielectric material so as to connect to the contact opening and removing the sacrificial fill material through the trench. Moreover, the method comprises filling the contact opening and the trench with a conductive material.

A further illustrative method disclosed herein comprises forming a contact opening in an interlayer dielectric material that is formed above and adjacent to a circuit element of a semiconductor device. The method additionally comprises forming a dielectric material of a first metallization layer above the interlayer dielectric material and the contact opening. Moreover, the method comprises forming a trench of a metal line of the first metallization layer in the dielectric material so as to connect to the contact opening. Additionally, the method comprises filling the contact opening and the trench with a conductive material by performing a deposition sequence commonly for the contact opening and the trench.

One illustrative semiconductor device disclosed herein comprises a circuit element formed in and above a semiconductor region, wherein the circuit element comprises a contact area. The semiconductor device further comprises an interlayer dielectric material formed above and adjacent to the circuit element and a contact element that is formed in the interlayer dielectric material and connects to the contact area. Additionally, the semiconductor device comprises a metallization layer comprising a dielectric material and a conductive line formed in the dielectric material, wherein the conductive line connects to the contact element and comprises at least one conductive material that extends continuously to a bottom of the contact element.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor devices and manufacturing techniques in which contact elements, such as contact plugs, contact trenches and the like, may be formed with superior electrical performance by providing a substantially continuous transition between the conductive material of the metal lines in the first metallization layer and the contact elements. On the other hand, the patterning process for providing the contact openings may be separated from the patterning process for forming the trenches in the first metallization layer, thereby providing superior process control. In some illustrative embodiments disclosed herein, the contact openings may be filled with a sacrificial fill material, such as a polymer material and the like, which may be efficiently removed in a later manufacturing stage, which, however, provides superior surface topography when depositing the dielectric material of the metallization system. The dielectric material of the metallization layer may comprise, in some illustrative embodiments, an etch stop material so as to achieve superior process control upon forming trenches of the metallization layer. In other illustrative embodiments, the dielectric material of the metallization layer, such as a low-k dielectric material, may be directly formed on the interlayer dielectric material and the sacrificial fill material, thereby reducing overall process complexity and enhancing electrical performance of the overall wiring system of the semiconductor device.

In still other illustrative embodiments, a portion of the dielectric material of the first metallization layer may be deposited above the interlayer dielectric material so as to substantially close the contact openings formed therein without depositing significant amounts of dielectric material therein. Consequently, during the further processing, the dielectric material may be patterned so as to form trenches therein, thereby also efficiently reopening the contact opening prior to performing a common fill sequence for introducing a desired conductive material for the first metallization layer and the contact level of the semiconductor device.

Figure 1A:
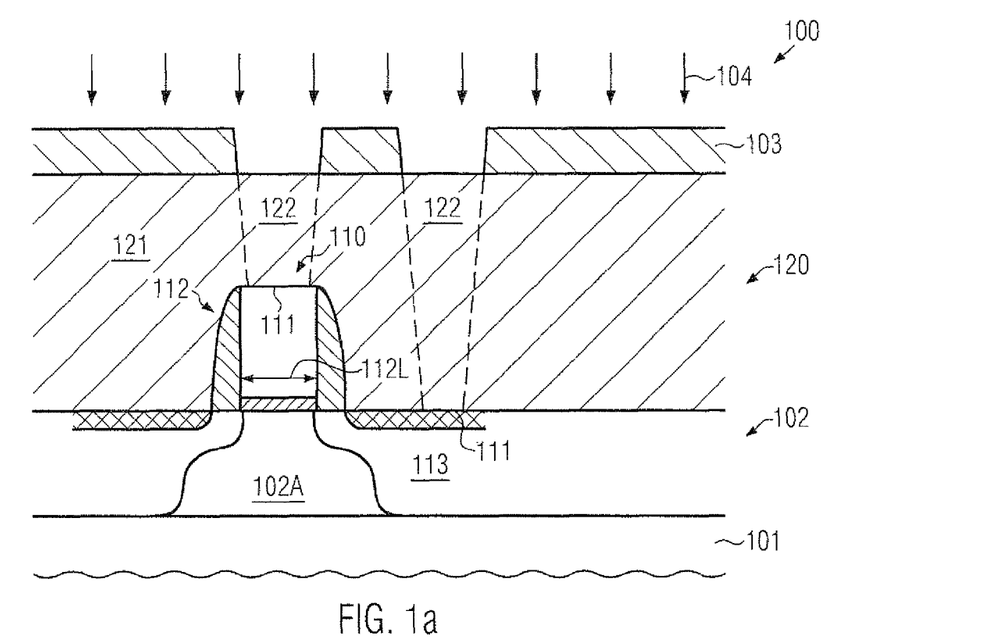
FIGS. 1a-1h schematically illustrate cross-sectional views of a semiconductor device during various manufacturing stages when forming a contact level connecting to a first metallization layer on the basis of a damascene strategy for commonly filling the contact opening and the metal line, according to illustrative embodiments.

FIG. 1a schematically illustrates a cross-sectional view of a semiconductor device 100 comprising a substrate 101 and a semiconductor layer 102. The substrate 101 may represent any appropriate carrier material for forming thereabove the semiconductor layer 102, such as a semiconductor material, an insulating material and the like. The semiconductor layer 102 may comprise any appropriate material composition or materials, such as silicon, germanium, compound semiconductors and the like, as is required for forming circuit elements 110, such as transistors, capacitors, and the like in, and above the semiconductor layer 102. To this end, the layer 102 may comprise a plurality of semiconductor regions or active regions 102A, which are to be understood as areas within the semiconductor layer 102 in which PN junctions may be provided so as to form at least one semiconductor circuit element, such as a transistor, in and above the region 102A. It should be appreciated that the semiconductor region 102A may be laterally delineated in the layer 102 by appropriate isolation structures (not shown), such as shallow trench isolations and the like. In the embodiment shown in FIG. 1a, the circuit element 110 may represent a transistor comprising a gate electrode structure 112, which may have a critical dimension, such as a gate length 112L, of approximately 40 nm and less, when sophisticated applications are considered. Furthermore, the transistor 110 may comprise drain and source regions 113. It should be appreciated, however, that the transistor 110 may represent any appropriate semiconductor-based circuit element which may be formed on the basis of a critical dimension, for instance in the above-specified range, irrespective of the device architecture. That is, the principles disclosed herein may also apply to any transistor architecture, such as three-dimensional transistors or FINFET transistors, transistors comprising raised drain and source regions, recessed drain and source regions, buried gate electrode structures and the like. Similarly, any appropriate materials may be used in the circuit element 110, such as high-k dielectric materials, i.e., dielectric materials having a dielectric constant of 10.0 and higher, in combination with superior electrode materials for the gate electrode structure 112, if required. Irrespective of the specific configuration of the circuit element 110, at least one contact area 111, for instance provided in the drain or source regions 113, for instance in the form of a metal silicide, may be provided. In the example shown, a contact region may also be provided in the gate electrode structure 112, wherein, in the example shown, these contact areas may be provided at different height levels, i.e., with a different distance with respect to the semiconductor layer 102.

Moreover, the semiconductor device 100 may comprise a contact level 120, which, in the manufacturing stage shown, may comprise any appropriate dielectric material 121, which is to be understood as a single homogeneous material, or which may be provided in the form of two or more individual material layers, which may differ in material composition, internal stress level and the like. For example, frequently, materials such as silicon nitride and silicon dioxide may be used in combination for forming an interlayer dielectric material, i.e., the material 121 of the contact level 120. Furthermore, in the manufacturing stage shown, an etch mask 103, such as a resist material, a hard mask material, possibly in combination with any anti-reflective coating (ARC) materials, may be provided above the interlayer dielectric material 121 in order to form appropriate contact openings 122 therein, which may connect to the contact areas 111.

The semiconductor device 100 as illustrated in FIG. 1a may be formed on the basis of the following processes. After providing the active region 102A on the basis of any appropriate process strategy, for instance by forming isolation structures applying sophisticated lithography, etch, deposition and planarization techniques, the circuit element 110 may be formed in accordance with any process technique. For example, in CMOS technologies, the gate electrode structure 112 may be provided by depositing appropriate materials and patterning the resulting layer stack so as to obtain the structure 112 having the desired critical dimension 112L. It should be appreciated that, in other device strategies, the gate electrode structure 112 may be completed in a later manufacturing stage, for instance by replacing one or more materials in the gate electrode structure 112 with sophisticated material or material systems, for instance comprising high-k dielectric materials, metal-containing electrode materials and the like. Furthermore, the drain and source regions 113 or any other appropriate dopant profile may be established, for instance on the basis of implantation techniques in combination with anneal processes, and the like. If required, the conductivity of the contact areas 111, for instance in the drain and source regions 113, may be increased by forming a metal silicide, which may also be formed in the gate electrode structure 112. In other strategies, the interlayer dielectric material 121, or at least a portion thereof, may be formed and may be used as a mask material for replacing a part of the gate electrode structure 112 by any desired sophisticated material system. Thereafter, the interlayer dielectric material 121 may be completed, followed by the deposition of the mask material 103 and the patterning thereof on the basis of sophisticated lithography techniques. Consequently, by providing the interlayer dielectric material 121 in accordance with any desired process strategy and patterning the same by using the etch mask 103, a high degree of compatibility with conventional process strategies may be maintained, while, on the other hand, the contact openings 122 may be filled commonly with metal lines of the first metallization layer still to be formed, however, without adding additional complexity in patterning the contact openings 122. To this end, any appropriate etch process 104 may be applied, such as well-established anisotropic etch recipes and the like.

Figure 1B:
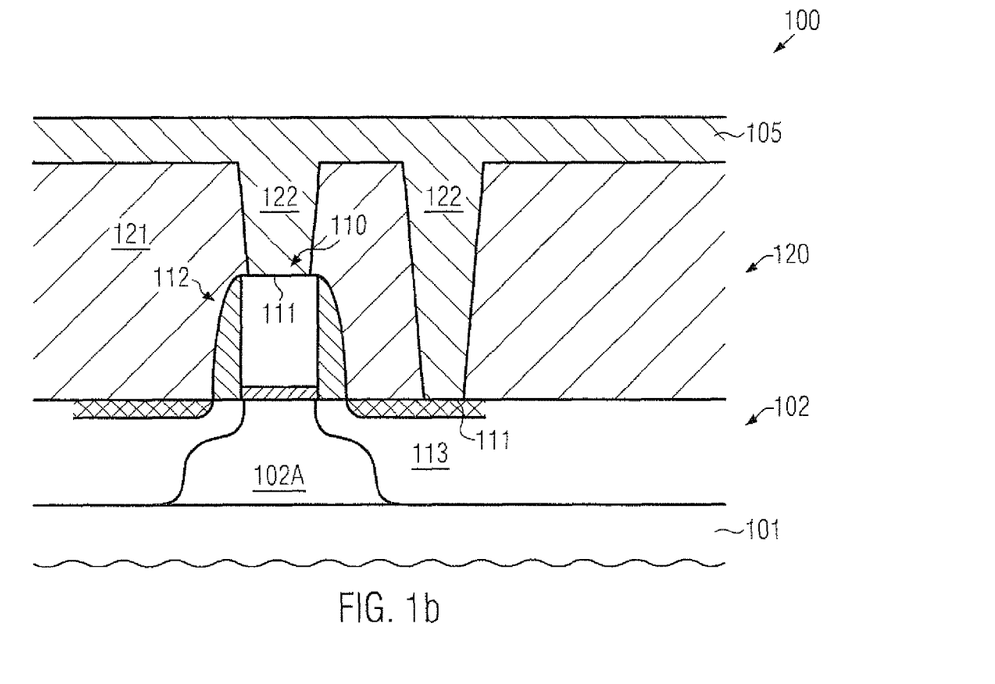

FIG. 1b schematically illustrates the semiconductor device 100 in a further advanced manufacturing stage. As illustrated, after removal of the etch mask 103 (FIG. 1a), a sacrificial fill material 105 may be provided above the interlayer dielectric material 121 so as to fill the contact openings 122. For example, a plurality of planarization materials are available, which may frequently be used for providing a superior surface topography, for instance in view of critical lithography processes and the like. Typically, such planarization materials may be provided as organic materials that may be applied in a low viscous state, thereby providing superior gap-filling capabilities, while at the same time providing a substantially planar surface topography. On the other hand, these materials may be efficiently removed, for instance, on the basis of wet chemical etch chemistries, plasma-assisted processes, such as oxygen plasma processes, and the like, wherein pronounced etch selectivity may be observed with respect to a plurality of well-established materials, such as silicon, silicon dioxide, metal silicide and the like. That is, the sacrificial fill material 105 may be deposited in a highly non-conformal manner and may be efficiently removed at a later manufacturing stage, without unduly affecting other device areas and materials.

It should be appreciated that other material compositions may also be applied, for instance, by any appropriate deposition technique, such as CVD, so as to provide the material 105 with the desired etch characteristics.

After the deposition of the material 105, depending on the material composition and material characteristics, treatments, such as radiation curing, heat treatments and the like, may be applied so as to obtain a desired mechanical stability and temperature insensitivity so as to not unduly interfere with the further processing of the device 100. For example, polymer materials may be efficiently hardened to withstand temperatures of several hundred degrees Celsius.

Figure 1C:
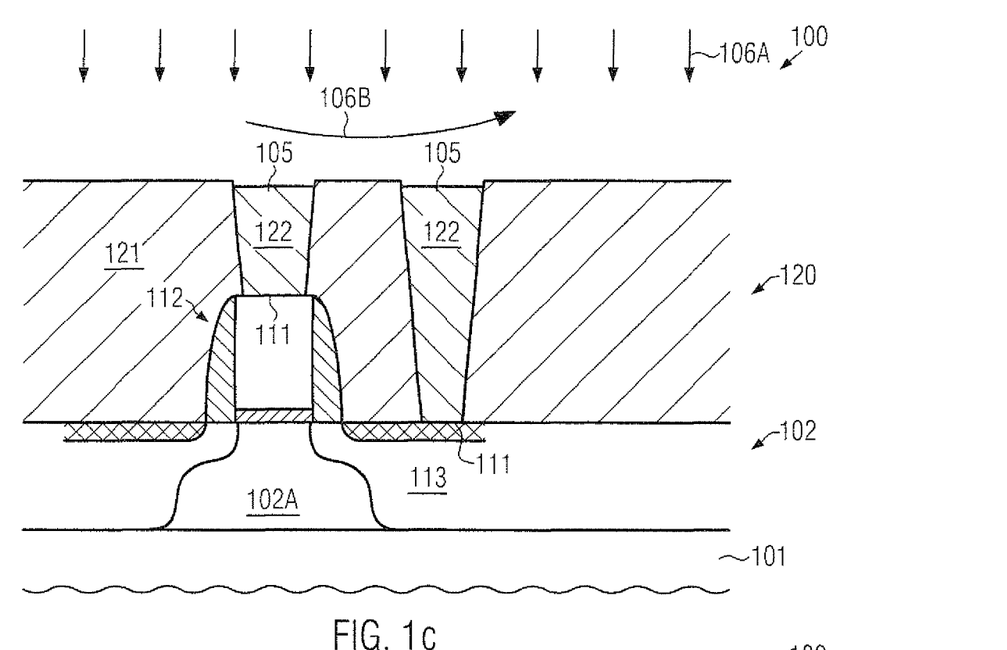

FIG. 1c schematically illustrates the semiconductor device 100 in a further advanced manufacturing stage, in which the excess material of the sacrificial fill material 105 may be removed by a process 106A, which may represent an etch process, while, in other cases, in addition to or alternatively, a polishing process 106B may be applied. For example, applying a polishing process after depositing the material 105 and possibly treating the same may result in a superior surface topography, which in turn may allow a more efficient removal of any excess material, for instance by an etch process. In other cases, any excess material may be efficiently removed by the polishing process 106B based on a moderately mild polishing process, thereby not unduly affecting the interlayer dielectric material 121. In other cases, as previously explained, the etch process 106A may be performed as a wet chemical etch process or a plasma-assisted process, wherein the interlayer dielectric material 121 may be used as an efficient etch stop material for controlling the removal process 106A. Consequently, the contact openings 122 may provide an appropriate surface topography for the further processing of the device 100.

Figure 1D:
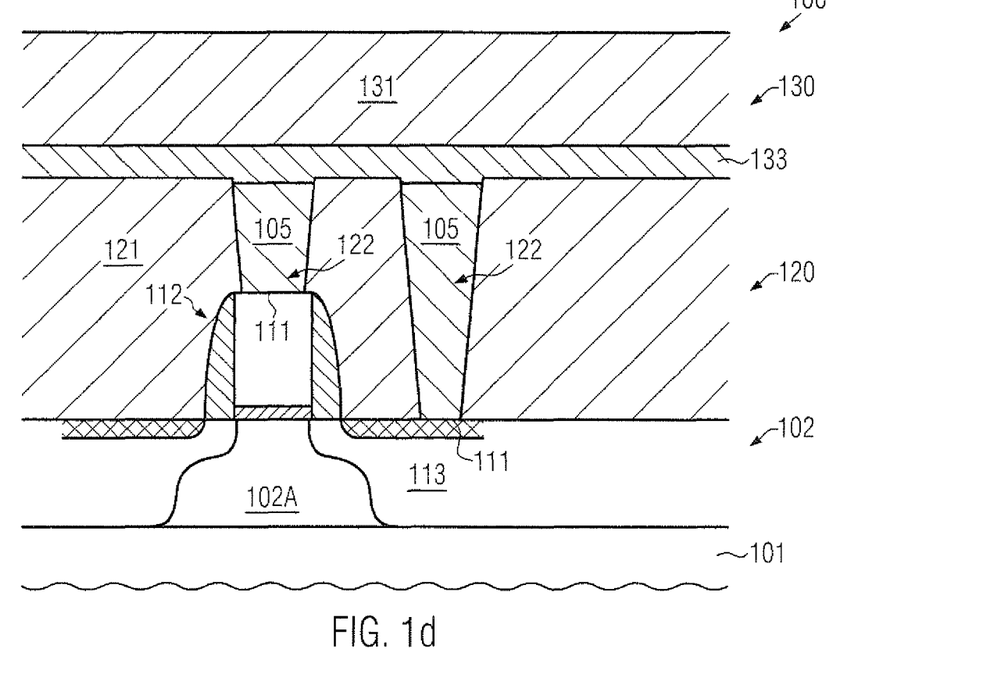

FIG. 1d schematically illustrates the semiconductor device 100 in a further advanced manufacturing stage, in which one or more dielectric materials of a metallization layer 130 are formed above the interlayer dielectric material 121 and the contact openings 122 comprising the sacrificial fill material 105. In the embodiment shown, a first dielectric material 133, which may also be considered as an etch stop material, may be provided, followed by the actual dielectric material 131 of the metallization layer 130, which may thus comprise any appropriate material composition, such as a low-k dielectric material and the like, thereby reducing the parasitic capacitance between neighboring metal lines to be formed in the metallization layer 130.

Dielectric material 133 may be formed on the basis of a superior surface topography, due to the presence of the sacrificial material 105 and due to the fact that the interlayer dielectric material 121 may not have been subjected to complex metal polishing processes, which are typically required in conventional strategies after filling the contact openings 122 with the contact metal, as described above. The dielectric material 133 may be formed on the basis of any appropriate material composition, such as silicon nitride, possibly in combination with carbon, silicon dioxide and the like. Thereafter, the dielectric material 131 may be provided, for instance, by CVD, spin-on techniques and the like, depending on the material characteristics and the like. Next, a patterning sequence may be performed so as to form trenches in the dielectric material 131 and finally in the material 133, which may be accomplished by applying any appropriate process strategy. For example, one or more sacrificial materials, such as hard mask materials, ARC materials and the like, may be provided and may be patterned on the basis of a lithography process in order to provide an etch mask having the desired lateral dimensions. Thereafter, an etch process may be applied so as to etch through the dielectric material 131, while the layer 133 may be used as an efficient etch stop material. To this end, a plurality of well-established anisotropic etch recipes are available and may be used, wherein silicon nitride, silicon carbide based dielectric materials and the like may be efficiently used as etch stop materials. Thereafter, the layer 133 may be opened, for instance, by appropriately changing the etch chemistry during a plasma-assisted etch process, wherein the interlayer dielectric material 121 may act as an efficient etch stop material, while, on the other hand, the sacrificial material 105 may substantially avoid any undue interaction of the reactive etch ambient with the contact areas 111, even if the material 105 may have a moderately high removal rate during the corresponding etch process.

Figure 1E:
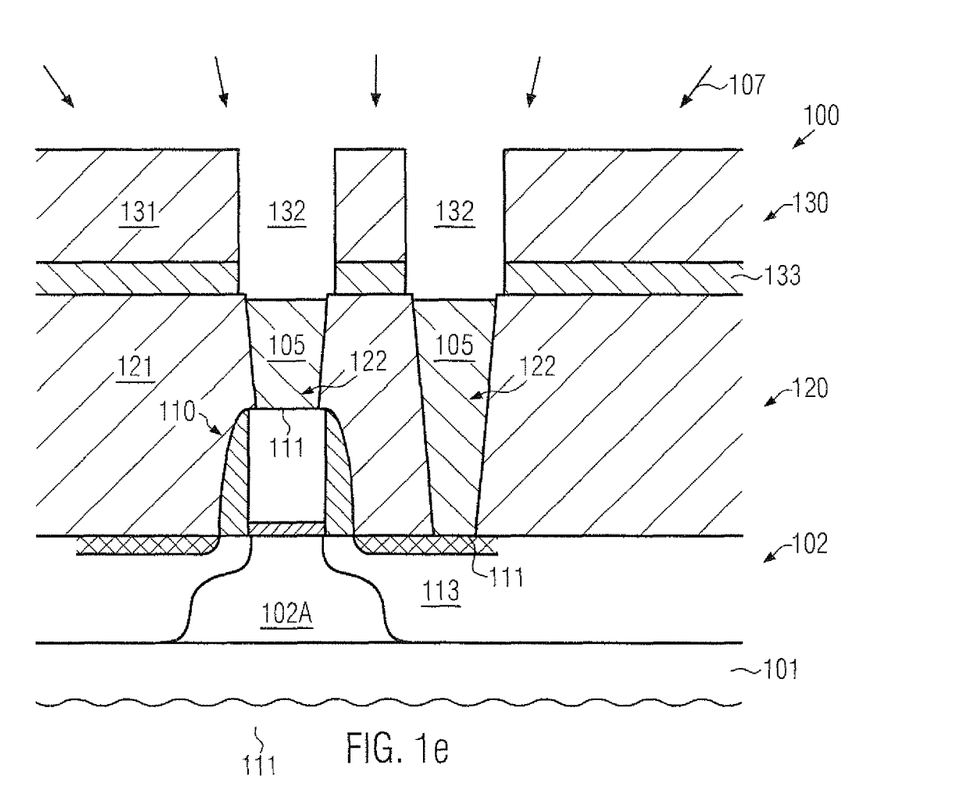

FIG. 1e schematically illustrates the semiconductor device 100 after the above-described process sequence. Consequently, trenches 132 may be provided in the dielectric materials 131 and 133, which may be aligned to specific contact openings, such as the openings 122, as shown in FIG. 1e. It should be appreciated that the contact openings 122 may have any appropriate shape, for instance, these openings may be provided as features having substantially the same lateral dimensions in the horizontal direction of FIG. 1e and in a second lateral direction, i.e., a direction perpendicular to the drawing plane of FIG. 1e. In other cases, the openings 122 may represent trench-like openings, which may also extend along a portion of the trenches 132, which in turn may represent line-like features, at least along a certain distance, in order to connect a plurality of the circuit elements 110 according to a specific circuit layout. Consequently, the sacrificial fill material 105 may be exposed within the trenches 132 and may thus be efficiently removed on the basis of any appropriate etch process 107. For example, as previously discussed, the sacrificial material 105 may have a high etch rate with respect to certain wet chemical or plasma-assisted etch recipes, thereby avoiding undue damage in other materials, such as the dielectric material 131. For example, oxygen plasma based processes, possibly in combination with wet cleaning processes, may be applied so as to efficiently remove the material 105 from the contact openings 122.

Figure 1F:
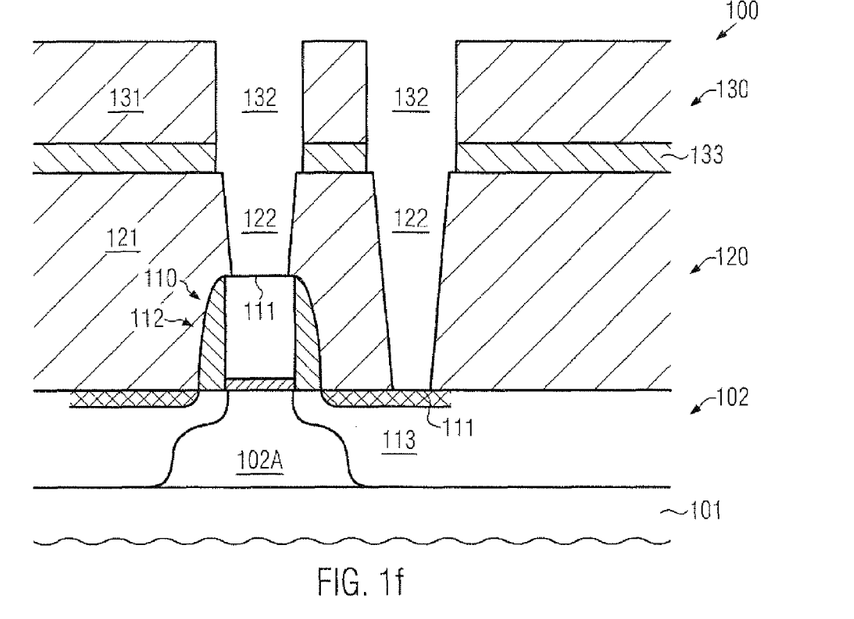

FIG. 1f schematically illustrates the semiconductor device 100 with the sacrificial material 105 (FIG. 1e) removed, thereby exposing the contact areas 111 of the circuit element 110. In this manufacturing stage, any additional process steps may be performed for preparing the device 100 for the deposition of conductive materials for filling the trenches 132 and the contact openings 122 during a common deposition sequence.

Figure 1G:
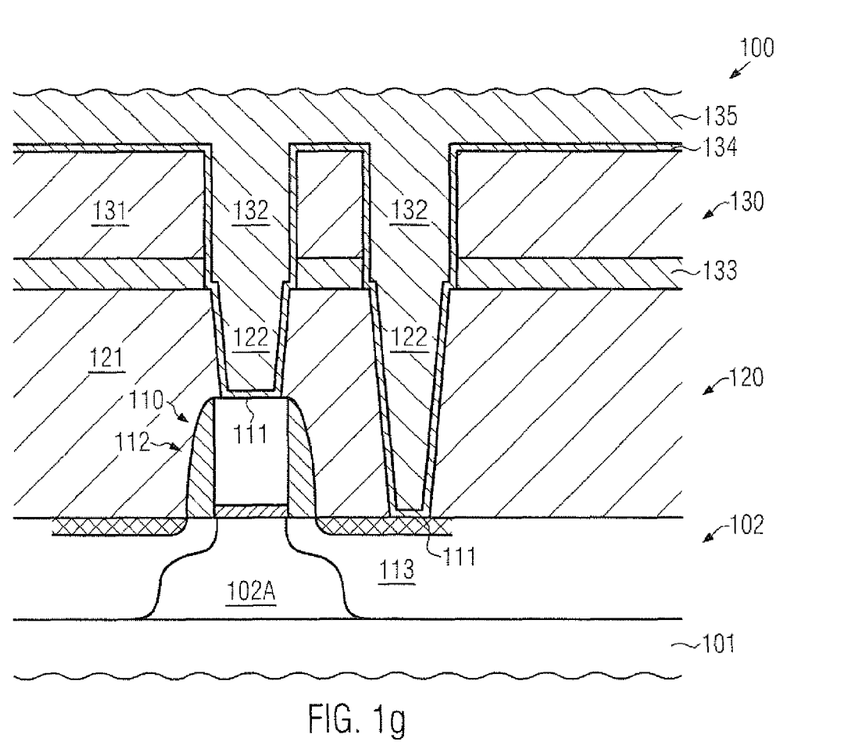

FIG. 1g schematically illustrates the device 100 in a further advanced manufacturing stage. As illustrated, a conductive barrier material 134 may be formed on the dielectric material 131 and within the trenches 132 and the contact openings 122 so as to continuously extend from the trenches 132 into the contact openings 122. Furthermore, one or more additional materials, such as highly conductive metals and the like, as indicated by 135, may be formed in the trenches 132 and the contact openings 122. In some illustrative embodiments, the conductive material 135 may comprise metals such as copper, silver and the like, which may have a low specific resistivity, thereby providing superior electrical performance compared to, for instance, conventionally used tungsten materials. Moreover, the material 135 may be formed homogeneously in the trenches 132 and the contact openings 122, thereby forming a homogeneous transition between the trenches 132 and the openings 122.

The conductive barrier material 134 may be formed on the basis of any appropriate deposition technique, such as sputter deposition, CVD, electrochemical deposition and the like. For example, in combination with copper material, an efficient diffusion blocking material may be required, such as tantalum, tantalum nitride, titanium, titanium nitride, cobalt, ruthenium and the like, which may be applied by various deposition techniques. Furthermore, if electrochemical deposition processes are to be applied, an appropriate catalyst material may be deposited by CVD, sputter deposition and the like. In some illustrative embodiments, the deposition of the material 134 may further comprise the deposition of a seed layer, which may be subsequently used during an electrochemical deposition process for providing the material 135. In other cases, the material 135 may be formed by CVD and the like.

Figure 1H:
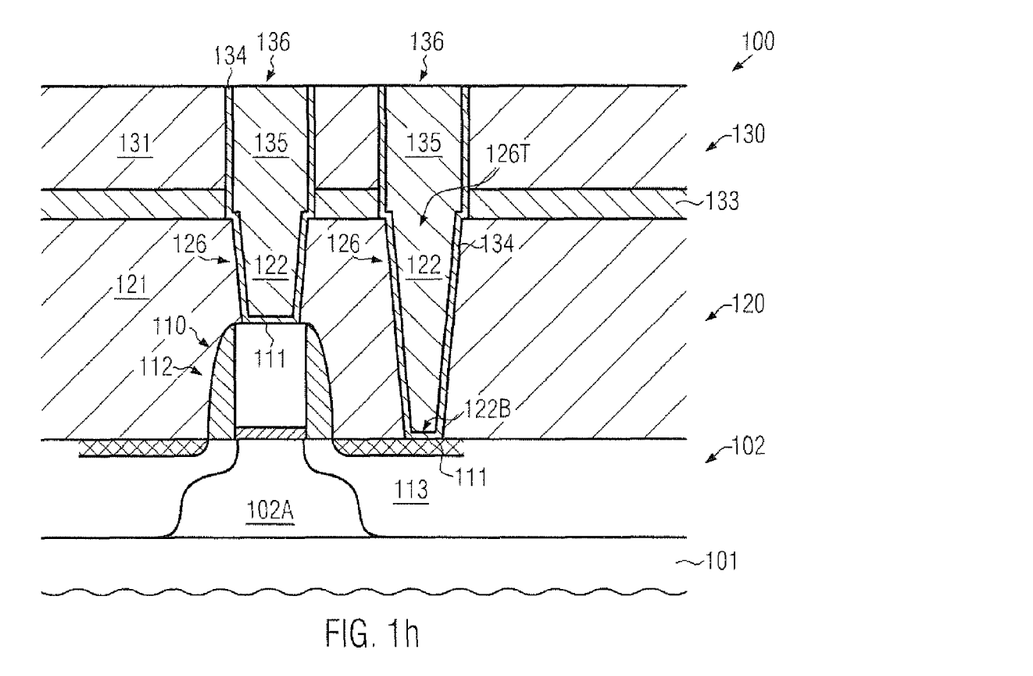

FIG. 1h schematically illustrates the semiconductor device 100 in a further advanced manufacturing stage. As illustrated, electrically isolated metal lines 136 may be provided in the metallization layer 130 and may comprise the conductive barrier material 134 and the highly conductive material 135. As discussed above, the conductive barrier material 134 may continuously extend into contact elements 126 and may further continuously extend to a bottom 122B of the contact opening 122, thereby connecting to the contact areas 111. Similarly, the highly conductive material 135 may continuously extend into the contact element 126 and may thus provide a homogeneous transition area 126T between metal line 135 and the contact element 126. Consequently, due to the presence of the highly conductive material 135 in the contact elements 126, superior electrical performance may be obtained, while additionally the lack of any intermediate barrier materials, as is the case in conventional strategies, may further result in superior performance.

The electrically isolated metal lines 136 may be formed by applying any appropriate material removal process or processes, such as CMP, electro-CMP, etching, combinations thereof and the like, so as to remove any excess material of the device 100 as illustrated in FIG. 1g.

As a consequence, superior performance of a contact level 120 may be accomplished due to the superior electrical characteristics of the contact elements 126 compared to conventional tungsten-based contact elements, while, additionally, a very efficient overall process flow may be achieved due to the common filling of the metal lines 136 and the contact elements 126. On the other hand, the patterning process may be based on the aspect ratios of the openings 122 and 132 (FIG. 2g) defined by the thickness of the dielectric materials 121 and 131, thereby allowing superior process control and thus process uniformity.

Figure 1I:
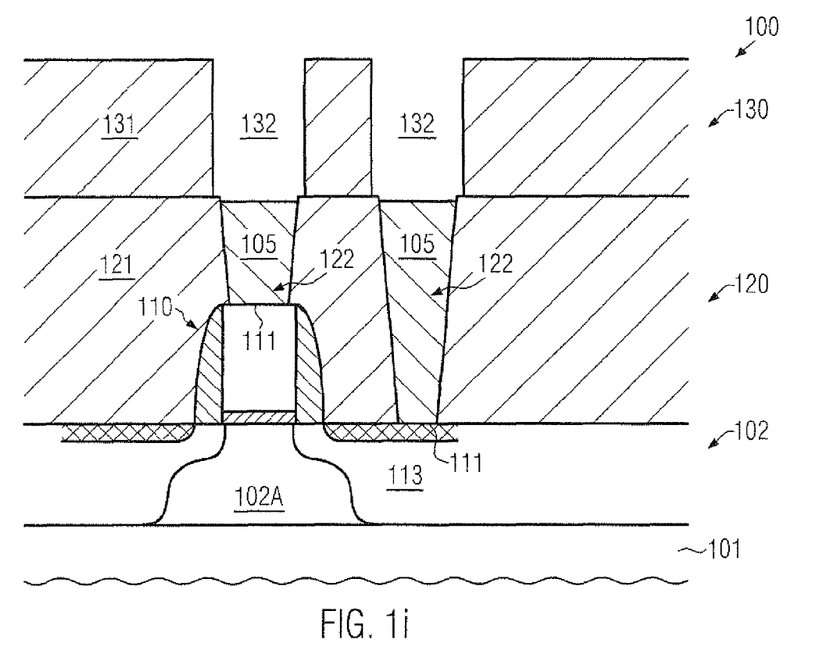
FIG. 1i schematically illustrates the semiconductor device accordance to further illustrative embodiments, in which the patterning of the dielectric material of the metallization layer is performed without providing an etch stop material.

FIG. 1i schematically illustrates the semiconductor device 100 according to further illustrative embodiments, in which the dielectric material of the metallization layer 130 may be provided substantially without a dedicated etch stop material. As shown, the material 131 may be provided as a substantially homogeneous material composition directly on the interlayer dielectric material 121, which may thus result in low parasitic capacitance values, since typically etch stop materials, such as silicon nitride, nitrogen-containing silicon carbide and the like, may have a greater dielectric constant compared to the material 131. Thus, the trenches 132 may be efficiently patterned by using the interlayer dielectric material 121 and the sacrificial fill material 105 as etch stop material, wherein the material 105 may then be removed, as is discussed above. Thereafter, the processing may be continued, as is described above, i.e., by performing a common fill process and removing any excess material so as to provide electrically isolated metal lines in the layer 130, while at the same time obtaining high performance contact elements in the contact openings 122, as is also described above.

Figure 1J:
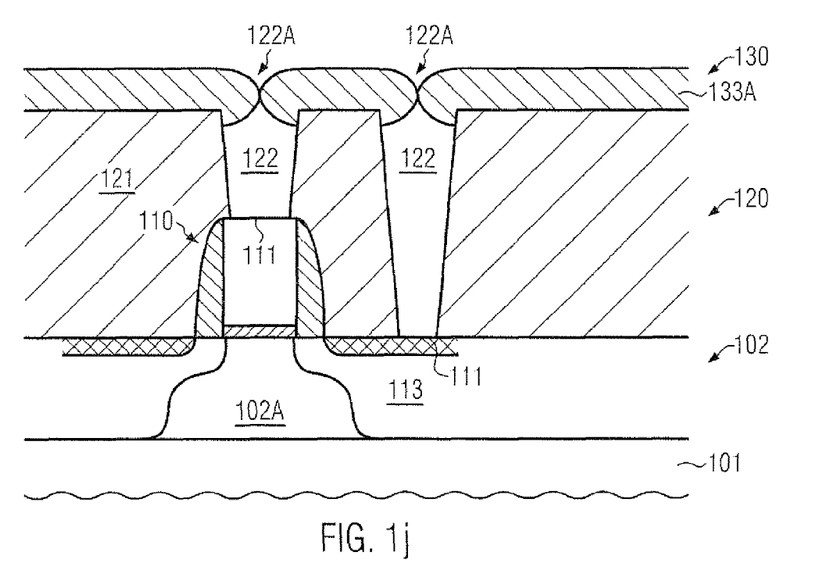
FIGS. 1j-1l schematically illustrate cross-sectional views of the semiconductor device according to further illustrative embodiments, in which the dielectric material of the first metallization layer may be provided above the contact openings without applying a sacrificial fill material.

FIG. 1j schematically illustrates the semiconductor device 100 according to further illustrative embodiments. As illustrated, the contact openings 122 may be formed in the interlayer dielectric material 121, which may be accomplished on the basis of any process strategy, as is described above. Furthermore, a portion of a dielectric material, indicated by 133A, of the metallization layer 130 may be formed above the dielectric material 121 and above the contact openings 122, thereby substantially closing an upper portion 122A thereof. That is, upon depositing the material 133A, deposition parameters may intentionally be selected such that significant overhangs may form at the portions 122A in the initial phase of the deposition process, thereby increasingly closing the contact openings 122. For example, corresponding deposition parameters may be readily determined on the basis of experiments and the like for a plurality of materials. For example, the material 133A may be provided in the form of an etch stop material, as is also previously explained, while, in other illustrative embodiments, the material 133A may represent a dielectric material having a desired dielectric constant so as to not unduly increase the overall parasitic capacitance values. For example, the material 133A may be provided with substantially the same material composition as the remaining portion of a dielectric material of the metallization layer 130, if considered appropriate. Thereafter, processing may be continued by depositing a further portion or a different desired dielectric material and patterning the same, as is described above. Consequently, upon patterning the dielectric material 133A, the material may also be efficiently removed from the upper portions 122A, thereby substantially completely re-opening the contact openings 122.

Figure 1K:
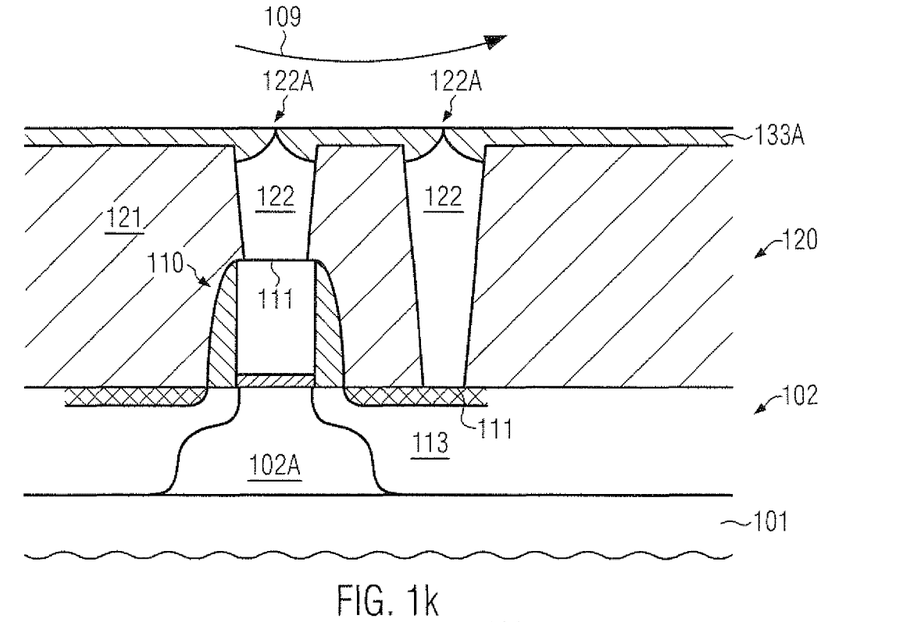

FIG. 1k schematically illustrates the semiconductor device 100 according to further illustrative embodiments, in which a planarization process 109 may be performed at any appropriate stage upon providing the material 133A, thereby also providing superior surface topography for the further deposition of any dielectric material, such as a low-k dielectric material and the like. During the removal process 109, which may be provided in the form of a CMP process, excess material may also be removed from the upper portions 122A, thereby providing superior etch conditions during the further processing of the device 100.

Figure 1L:
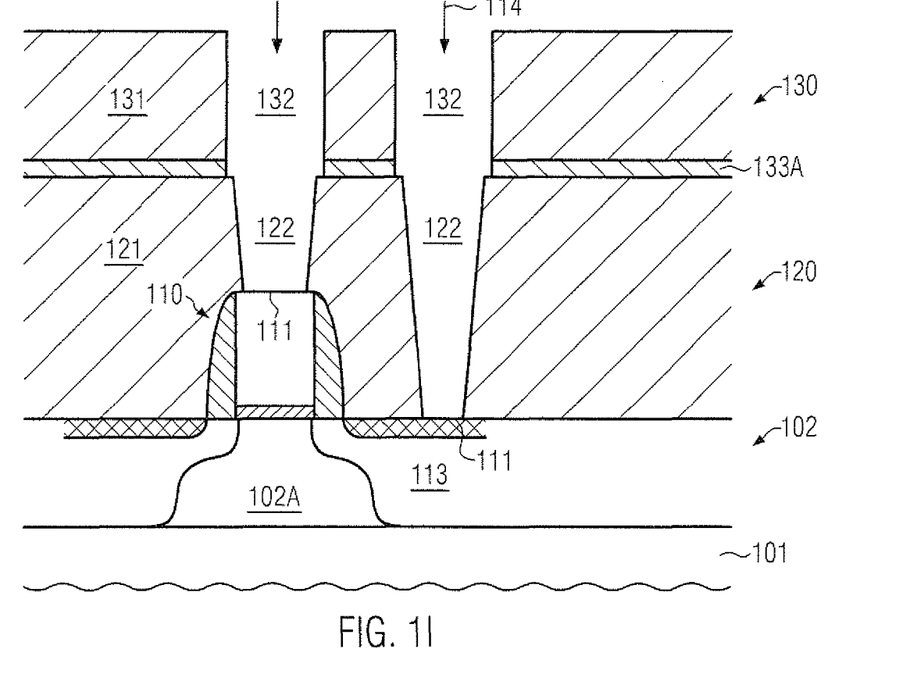

FIG. 1l schematically illustrates the semiconductor device 100 in a further advanced manufacturing stage. As illustrated, trenches 132 may be formed in the dielectric material 131, which is formed on the dielectric material 133A, which may have the same or a different composition compared to the material 131, as discussed above. Furthermore, the device 100 is shown during an etch process 114 for etching through the material 133A, thereby also re-opening the contact openings 122, without requiring the removal of any sacrificial material from deeper portions of the contact openings 122. Consequently, any additional processes for removing material residues for preparing the device 100 for the subsequent deposition of conductive fill materials may have a less aggressive behavior, thereby contributing to superior integrity of, for instance, the contact areas 111.

Thereafter, the processing may be continued by depositing any appropriate material or material systems as is also described above.

As a result, the present disclosure provides semiconductor devices and manufacturing techniques in which contact elements in a contact level may be provided with superior electrical performance by avoiding a transition area of reduced conductivity between the metal lines of the first metallization layer and the contact elements. To this end, a common fill deposition sequence may be applied to the metal lines and the contact elements, wherein, however, the patterning of these features may be performed in separate processes, thereby contributing to superior process control and thus process uniformity. In some illustrative embodiments, the contact openings may be filled with a sacrificial fill material, while, in other cases, appropriate closure of the contact openings may be accomplished on the basis of a dielectric material of the first metallization layer. Furthermore, since any sophisticated metal polish processes in the contact level may be avoided, generally, superior process conditions may be achieved for forming the first metallization layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a contact element in a semiconductor device, the method comprising:

forming a sacrificial fill material in a contact opening formed in an interlayer dielectric material, said contact opening connecting to a contact area of a circuit element formed in a semiconductor region of said semiconductor device;

after forming said sacrificial fill material, forming a dielectric material of a metallization layer above said interlayer dielectric material and said sacrificial fill material;

forming a trench in said dielectric material so as to connect to said contact opening;

removing said sacrificial fill material through said trench; and filling said contact opening and said trench with a conductive material.

2. The method of claim 1, wherein forming said dielectric material layer comprises forming an etch stop layer above said interlayer dielectric material and forming a dielectric layer on said etch stop layer.

3. The method of claim 2, wherein forming a trench in said dielectric material comprises patterning said dielectric layer by using said etch stop layer as an etch stop and patterning said etch stop layer.

4. The method of claim 1, wherein forming said dielectric material comprises forming a substantially homogeneous material composition on said interlayer dielectric material and said sacrificial fill material.

5. The method of claim 1, wherein filling said trench and said contact opening with a conductive material comprises forming a conductive barrier material on inner surface areas of said contact opening and said trench and depositing a metal-containing material on said conductive barrier material.

6. The method of claim 1, wherein filling said contact opening and said trench with a conductive material comprises depositing at least one of copper and silver.

7. The method of claim 1, wherein said contact opening and said trench are filled by performing a deposition process sequence commonly for filling said contact opening and said trench.

8. The method of claim 1, wherein removing said sacrificial fill material comprises performing at least one of a plasma-assisted removal process and a wet chemical etch process.

9. The method of claim 1, wherein removing said sacrificial fill material comprises performing an evaporation process.

10. The method of claim 1, wherein forming said sacrificial fill material in said contact opening comprises forming a sacrificial material layer above said interlayer dielectric material and removing excess material by performing at least one of an etch process and a polishing process.

11. A method, comprising:
   forming a contact opening in an interlayer dielectric material formed above and adjacent to a circuit element of a semiconductor device;
   after forming said contact opening, forming a dielectric material of a first metallization layer above said interlayer dielectric material and said contact opening;
   forming a trench of a metal line of said first metallization layer in said dielectric material so as to connect to said contact opening; and
   filling said contact opening and said trench with a conductive material by performing a deposition sequence commonly for said contact opening and said trench.

12. The method of claim 11, further comprising filling said contact opening with a sacrificial fill material prior to forming said dielectric material.

13. The method of claim 12, further comprising removing said sacrificial fill material after forming said trench.

14. The method of claim 11, wherein forming said dielectric material comprises depositing material above said contact opening so as to substantially close an upper portion of said contact opening.

15. The method of claim 11, wherein forming said dielectric material comprises forming a first dielectric layer above said interlayer dielectric material and forming a second dielectric layer above said first dielectric layer.

16. The method of claim 14, further comprising planarizing at least a portion of said material prior to forming said trench.

17. The method of claim 14, wherein substantially closing off an upper portion of said contact opening comprises leaving a void space in said contact opening below said dielectric material.

\* \* \* \* \*